United States Patent [19]
Holkeboer

[11] Patent Number: 4,672,203
[45] Date of Patent: Jun. 9, 1987

[54] TWO STAGE VALVE FOR USE IN PRESSURE CONVERTER

[75] Inventor: David H. Holkeboer, Camillus, N.Y.

[73] Assignee: Inficon Leybold-Heraeus, Inc., East Syracuse, N.Y.

[21] Appl. No.: 797,793

[22] Filed: Nov. 14, 1985

Related U.S. Application Data

[63] Continuation of Ser. No. 496,522, May 20, 1983, abandoned.

[51] Int. Cl.⁴ .................................... H01J 49/04
[52] U.S. Cl. ................................ 250/289; 250/281; 137/630.15; 251/113
[58] Field of Search ............... 137/630.15; 251/113, 251/114, 115, 116; 250/288, 289, 430, 281

[56] References Cited

U.S. PATENT DOCUMENTS

| | | | |
|---|---|---|---|
| 961,220 | 6/1910 | Everson et al. | 251/113 |
| 2,888,953 | 6/1959 | Gratzmuller | 137/630.15 |
| 3,211,419 | 10/1965 | Klinger-Lohr | 137/630.15 |
| 3,253,612 | 5/1966 | Curatula et al. | 137/630.15 |
| 3,371,143 | 2/1968 | Wynne | 137/630.15 |
| 3,572,386 | 3/1971 | Sherwin | 137/630.22 |
| 3,888,280 | 6/1975 | Tartaglia | 137/630.15 |
| 4,170,892 | 10/1979 | Bailtis | 73/23 |
| 4,172,020 | 11/1979 | Tisone et al. | 204/192 R |

OTHER PUBLICATIONS

Dennison, Mass Spectrometry Applied to a Reactive Ion Mill, Solid State Tech., Sep. 1980.

*Primary Examiner*—Bruce C. Anderson
*Assistant Examiner*—Paul A. Guss
*Attorney, Agent, or Firm*—Bruns and Wall

[57] ABSTRACT

A multi-stage valve having a valve housing containing an inlet port and an outlet port that communicate through means of an elongated chamber formed in the housing. An outer sealing unit is mounted in the chamber and is adapted to close in sealing contact against one of the ports. A control orifice is passed through the first sealing unit to restrict the flow through the port when the unit is sealed thereagainst. A second inner sealing unit is mounted in the chamber behind the outer unit and is arranged to close thereagainst to seal the orifice. The two units are coupled by a lost motion mechanism which permits the sealing units to close in sequence between a fully closed position, an intermediate position wherein the flow through the valve is restricted by the orifice and a fully opened position wherein the flow through the valve is unrestricted.

4 Claims, 5 Drawing Figures

TWO STAGE VALVE FOR USE IN PRESSURE CONVERTER

This application is a continuation of application Ser. No. 496,522, filed May 20, 1983, now abandoned.

BACKGROUND OF THE INVENTION

This invention relates generally to a multi-stage valve, and in particular, to a valve suitable for use as a pressure converter in a vacuum process.

In many vacuum processes, such as vapor deposition processes, the vacuum chamber of the system is initially pumped down to a relatively low pressure (high vacuum) to rid the chamber atmosphere of any undesirable substances that might adversely affect the process. In the vapor deposition process, once the chamber has been cleared, one or more process gases may be added to the chamber atmosphere to provide an environment for maintaining or obtaining a deposition composition of predetermined character. The partial pressure (rough vacuum) of the process gases provided to the chamber is generally greater than the initial high vacuum pressure. In U.S. Pat. No. 4,172,020, a system is described for monitoring sputtering deposition parameter and achieving rapid modification of these parameters in order to obtain desired film compositions.

It is important in many vacuum applications to sample or analyze the chamber atmosphere for control purposes at the high vacuum pressures and one or more rough vacuum pressures. As illustrated in the above noted patent, a differentially pumped quadrupole mass analyzer is connected into the vacuum chamber for recovering samples of the chamber atmosphere and, in response thereto, generating control signals for regulating the process. Typically, a pressure converter is required in order to obtain sample materials at the different operating pressures. In a two-stage process, the pressure converter normally consists of two separate control valves that are interconnected by a rather complex bypass circuit that allows one of the two valves to be selectively isolated from the flow path connecting the chamber and the analyzer. Due to the complexity of the system, this type of converter is relatively expensive to construct and install. There also exists a high probability in this two-valve arrangement that one of the valves might be mispositioned thereby adversely affecting the process. When large quantities of thin film devices or the like are being manufactured during each process run, this type of loss can be relatively expensive and time consuming.

SUMMARY OF THE INVENTION

It is therefore an object of the present invention to improve multi-stage valves.

It is a further object of the present invention to provide a multi-stage valve that can be brought to different settings using one simple control.

A still further object of the present invention is to improve pressure converters that are used in vacuum processes.

Another object of the present invention is to provide a multi-stage pressure converter for use in a vacuum processing system which contains an easily changeable orifice plate for regulating the flow of sample materials between a vacuum chamber and a gas analyzer so as to provide for greater flexibility in the use of the system.

Yet another object of the present invention is to minimize the possibility of obtaining erroneous valve settings in a pressure converter system used to interconnect a vacuum deposition chamber with a gas analyzer.

These and other objects of the present invention are attained by means of a multi-stage valve assembly having a valve body containing an inlet and an outlet port that communicate through an internal chamber.

In one embodiment of the invention a pair of sealing units are stacked one over the other within the chamber so that the outer unit can be moved into sealing contact against one of the ports. The inner unit is driven toward and away from the port by a plunger and is coupled to the inner unit by means of a lost motion mechanism. The inner unit further includes a control orifice passing therethrough which restricts the flow of material through the valve when the inner member is brought into sealing contact against the port. Through means of the lost motion coupling, the outer sealing unit can be brought into sealing contact over the orifice to completely restrict the flow through the valve. Lifting both of the sealing units away from the port opens the valve and permits an unrestricted flow of material therethrough.

In a further embodiment of the invention, a series of sealing bodies are mounted in the chamber each of which contains a different size orifice. The size of the orifice openings is sequentially increased from the plunger side of the series toward the port side. The units are arranged to close against each other in sequence using a lost motion coupling whereby the flow of material through the valve can be regulated through a plurality of steps.

BRIEF DESCRIPTION OF THE DRAWINGS

For a better understanding of these and other objects of the present invention, reference is had to the following detailed description of the invention which is to be read in conjunction with the accompanying drawings, wherein.

DESCRIPTION OF THE INVENTION

Figure 1:
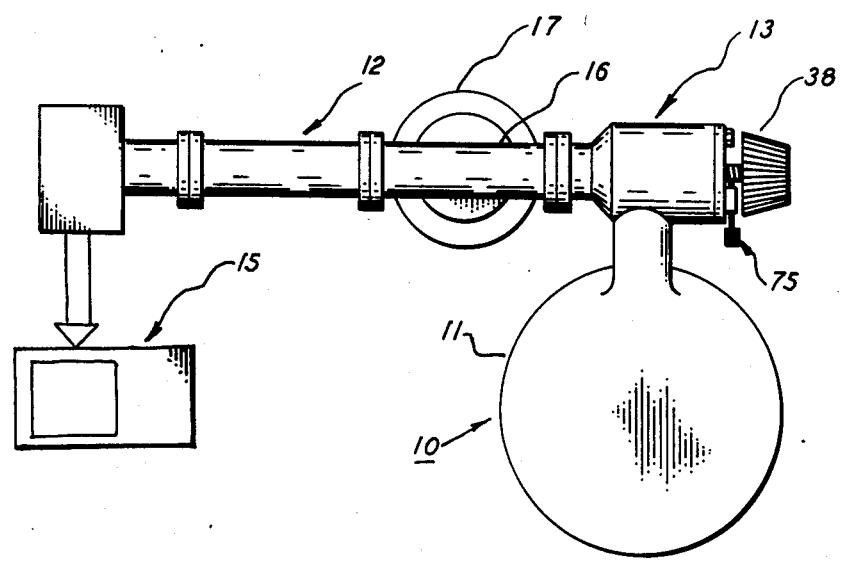
FIG. 1 is a general schematic view of a pressure converter containing a multi-stage valve embodying the present invention which illustrates the converter being used to connect a vacuum processor and a mass analyzer.

Turning initially to FIG. 1, there is shown in general schematic form a vacuum processor 10 of conventional design suitable for carrying out any number of vacuum-related processes. Although the present system is believed to have general utility in this type of environment, it may for example be used in a reactive vapor deposition process wherein a selected gas or gases at a partial pressure are added to the chamber atmosphere from a source in order (not shown) to react with a target material to modify a film being deposited upon a substrate. The system includes a vacuum chamber 11 which, in practice, is a hollow enclosure constructed to maintain relatively low pressures. The system also includes a vacuum pump 19 for bringing the chamber down to the required relatively low pressures. Samples of the process gases are drawn from the chamber and delivered to a quadrupole mass analyzer 12 through means of a pressure controller 13 which embodies the teachings of the present invention.

The quadrupole mass analyzer or spectrometer, upon receipt of a sample, ionizes the sample gases and focuses them upon a collector. It is sufficient for the purposes of this disclosure to understand that the mass analyzer isolates different mass-charge ratios found in the ionized sample so that information associated with each ionic species present can be determined. In the present system, the analyzer is arranged to operate in its own high vacuum and the pressure converter functions to bring samples of the chamber atmosphere into the analyzer region. The pressure converter makes it possible to transfer these samples from the chamber to the analyzer when the chamber is at either a high vacuum or a rough process vacuum. A controller 15 is connected to the analyzer to facilitate information gathering, storage and provides a control function for regulating various process related functions.

The quadrupole analyzer is connected via a flanged T-coupling 16 to a turbo pump 17. The sampling chamber of the mass spectrometer is pumped down to permit sampling at a desired high vacuum. As will be explained in greater detail below, an orifice plate is contained within the pressure converter which can be manually selected to allow correct sampling and analysis of sample materials in the rough vacuum ranges.

Figure 2A:
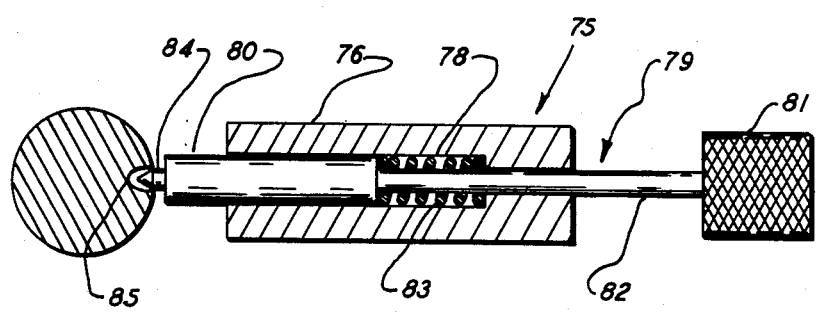
FIG. 2a is an enlarged side view in section showing a mechanism for sensing the position of the present valve.
Figure 2:
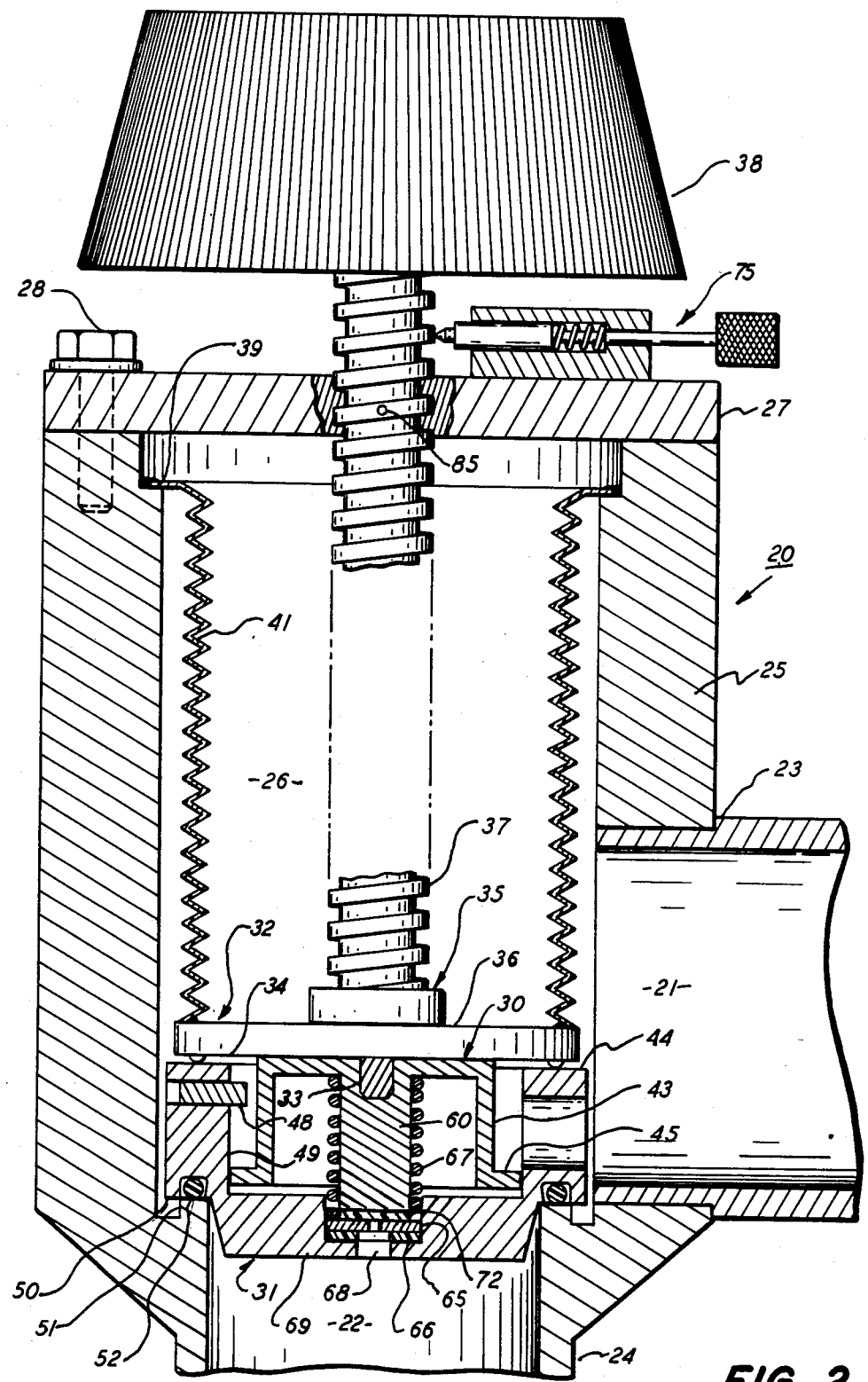
FIG. 2 is an enlarged cross section of the multi-stage valve embodied in the pressure converter of FIG. 1 further illustrating details thereof when the valve is placed in a fully closed position.
Figure 3:
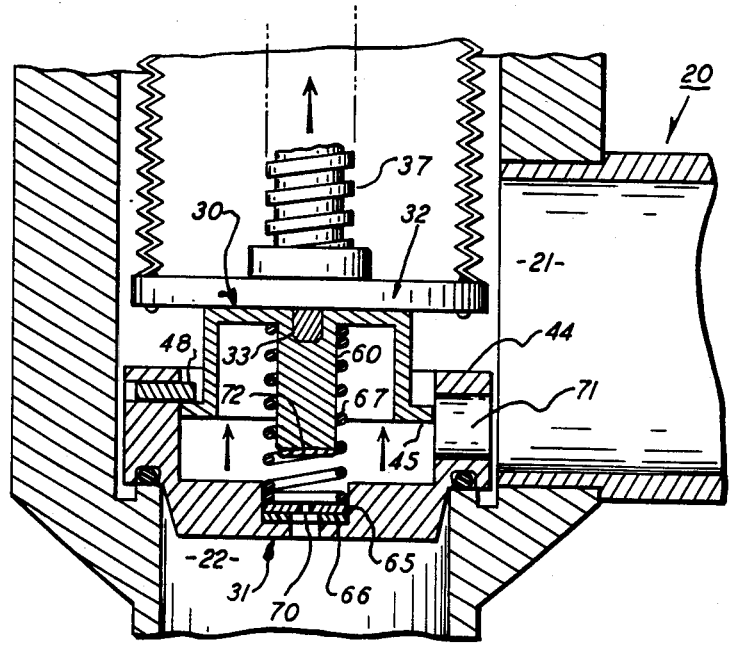
FIG. 3 is a view similar to that shown in FIG. 2 further illustrating the valve in an intermediate position wherein the flow through the valve is restricted by an orifice plate.
Figure 4:
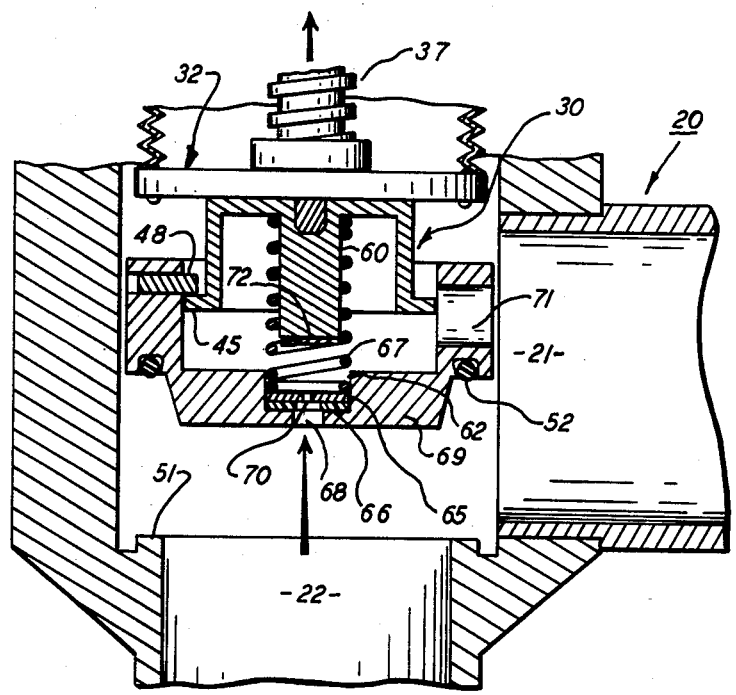
FIG. 4 is a further view similar to that shown in FIG. 2 illustrating the valve placed in a fully open position wherein the flow through the valve is unrestricted.

Referring now to FIGS. 2 through 4, there is illustrated in greater detail the two-stage valve 20 embodying the teachings of the present invention. FIG. 2 shows the valve in a fully closed position wherein the flow between inlet port 21 and outlet port 22 is completely shut off. The inlet port 21 is connected to the vacuum chamber 11 via an inlet line 23 while the outlet port is connected to the flange coupling 16 via a discharge line 24. The housing 25 of the two-stage valve further includes an elongated internal chamber 26 that is disposed axially within the housing body. In operation, the inlet port communicates with the outlet port through means of the interior chamber. The top section of the chamber is closed by a cover plate 27 using bolts 28 or any other type of removable fastener. Preferably, the chamber is circular in cross section and is axially aligned with the discharge line 24 along a commonly shared axis.

A pair of generally circular sealing units 30 and 31 are stacked one over the other within the chamber so that the units can move along the axis of the housing towards and away from the outlet port 22. The first or inner sealing unit 30 is secured to a circular plunger 32 by means of a fastener 33 which serves to hold the inner sealing unit tightly against the bottom surface 34 of the plunger. A swivel joint unit 35 is affixed to the top surface 36 of the plunger and is used to rotatably support the proximal end of a square threaded lead screw 37. The lead screw is, in turn, threaded through the top cover plate 27 of the valve. A hand-engageable knob 38 is secured to the exterior end of the lead screw which facilitates manual positioning on the plunger. As can be seen, turning the lead screw within the stationary cover plate raises or lowers the plunger in the housing and thus allows the inner sealing unit to be selectively positioned within the chamber.

A recessed shoulder 39 is formed in the top of the chamber side wall 40. One end of a collapsible bellows 41 is secured in fluid tight relationship against the shoulder while the other end of the bellows is similarly secured to the top surface 36 of the plunger. The bellows, in assembly, forms a flexible shield to prevent sample gases passing through the valve from otherwise escaping from the chamber.

The inner sealing unit 30 is telescoped within a circular opening 43 and passes downwardly through the top surface 44 of the second outer sealing unit 31 and the two units are coupled by a lost motion mechanism. A radially disposed flange 45 extends outwardly from the lower section of the inner sealing unit body section 46. The outer sealing unit 31 has a plurality of pins 48—48 staked into the sidewall 49 thereof. The pins extend inwardly into the opening 43 a sufficient distance so that the pins are capable of intercepting a radial flange 45 carried upon the outer unit. The inner unit is thus afforded a pre-determined amount of free travel within the outer unit by the lost motion coupling. Accordingly, the inner member can be raised or lowered by the plunger a given distance within the outer member before the two members come into physical contact.

The outer sealing unit 31 further includes an annular groove 49 machined in the front face 50 thereof in which is mounted a sealing ring 51. The sealing ring is adapted to close in sealing contact against a valve seat 52 formed about the periphery of the outlet port 22 when the valve is brought to either a fully-closed position as shown in FIG. 2 or an intermediate position as shown in FIG. 3.

The inner sealing unit 30 further includes a centrally located piston 60 that depends from radial wall 61 of the unit. The piston is adapted to be received within a cup-like recess 62 that is passed downwardly through the radially extended wall 69 of the outer unit. Seated within the recess is an orifice plate 65 that is mounted on top of an annular gasket 66. A wound compression spring 67 is wrapped about the outer periphery of the piston and, in assembly, is biased between the orifice plate and the top wall of the drive unit. The spring functions to hold both the orifice plate and the gasket securely within the recess to provide a gas tight seal therebetween. A hole 68 is passed upwardly through wall 69 of the outer unit which communicates directly with a metering hole 70 formed in the orifice plate. A sealing disc 72 is secured to the front face of the piston which is adapted to close over the metering hole 70.

When the valve is brought to a fully closed position as illustrated in FIG. 2, the piston 60 of the drive unit is forced into tight closing contact against the orifice plate and, at the same time, the sealing ring 50 of the outer unit is closed tightly against the valve seat 52 thus preventing sample gases from flowing between the inlet and discharge lines of the valve. Turning the lead screw in the proper direction initially raises the inner unit within the outer unit against the biasing action of the spring 67. Accordingly, the piston is pulled back from the orifice plate thus opening the metering hole and allowing a restricted amount of sample gas to pass through the valve. An access hole 71 is formed in the side wall of the driven unit to permit sample gases to reach the metering hole when the valve is placed in an intermediate position as shown in FIG. 3. The size of the metering hole is controlled so that the amount of sample material admitted to the mass spectrometer is closely regulated by the pressure difference that exists over the plate. As can be seen in FIG. 3, the spring continues to deliver biasing pressure against the outer unit to hold it seated against port 22 when the orifice is opened thus ensuring that the flow through the valve is restricted by the orifice plate.

A sensing mechanism, generally referenced 75, is mounted upon the cover plate of the valve which senses when the flange 45 of the inner sealing unit is about to make lifting contact with the pins 48—48 carried by the outer sealing unit. This, in turn, alerts the operator to the fact that the valve position is about to be changed from an intermediate setting to a fully open setting. The sensing mechanism includes a housing 76 that is secured to the top of the cover plate by any suitable means adjacent the lead screw. A laterally extended passage 78 is formed in the housing and slidably contains a sensing element 79. The sensing element includes a stop pin 80 that is connected to an externally mounted knurled head 81 by means of a shank 82. A biasing spring 83 is contained within the opening 78 which is adapted to urge the stop pin of the element towards the lead screw. The stop pin has a pointed tip 84 that is adapted to ride upon the outer land of the square threads of the screw. A stop hole 85 (FIG. 1) is cut into the lead screw into which the stop pin is forced when the inner unit is about to begin lifting the driven unit from the valve seat 52 through means of the lost motion coupling. At this time, the tip of the stop pin is forced firmly into the hole by the biasing spring thus preventing any further rotation of a lead screw. This, in turn, provides clear indication of the valve position.

To further move the valve towards a fully open position, the sensing element must be physically pulled back against the biasing action of the spring in order to release the lead screw. With the stop pin moved back, the lead screw can be further turned to raise the plunger within the valve chamber. This, in turn, causes the inner sealing unit to engage the outer sealing unit through the lost motion coupling whereupon the inner unit is lifted upwardly within the chamber. The two units are then raised together to a position as shown in FIG. 4 to allow an unrestricted flow of sample gas to pass through the valve between the inlet and outlet ports. A stop element may be included in the assembly inside the bellows that intercepts the plunger when the valve is brought to a fully opened position. In order to close the valve, the above described procedure is simply reversed until the lead screw can no longer be turned in a downwardly direction.

As can be seen, the present valve structure, although relatively simple in construction, provides for the selection of three separate operating modes using a single control knob. These conditions include a fully closed position wherein the gas analyzer is completely isolated from the vacuum chamber, a restricted flow position wherein the analyzer is able to sample the chamber atmosphere at rough vacuum pressures, and a fully open position wherein an unrestricted flow of gas is maintained between the chamber and the analyzer at high vacuum pressures. As should be now evident, the orifice plates can be quickly changed in the present valve assembly to provide for any number of intermediate flow settings. To change the orifice plate, the valve cover is simply opened and the valve bodies withdrawn from the chamber. Upon withdrawal, the two units are separated by turning one inside the other to free the flange of the drive unit. Once separated, the orifice plate, which is now exposed, can be simply slipped out of the receiving recess and replaced. The valve is then reassembled placing the system back on line. This type of changeover can be accomplished within a matter of minutes using simple tools thereby considerably extending the usefulness of the vacuum equipment.

In another embodiment of the invention, a series of orifice containing sealing units are positioned between the inner sealing unit and the outer sealing unit. Again each unit is coupled to the adjacent units by a lost motion mechanism so that the series opens and closes in sequence as the plunger is raised and lowered in the chamber. The size of each orifice is increased from the plunger side of the series towards the port side so that differing flow rates can be obtained as the units are closed in succession one against the other. Each orifice is sealed using a piston and spring arrangement as described above thus insuring that they will open and close in a desired sequence.

While this invention has been described with specific reference to the details shown above, it is not necessarily confined to these details and this application is intended to cover any modifications or changes that may come within the scope of the following claims.

I claim:

1. In a vacuum system wherein a vacuum chamber is connected to a pump for placing the chamber at a first high vacuum, and to a gas source for adding a selected gas into the chamber to place chamber at a second rough vacuum, the chamber pressure at the first high vacuum being less than that at the second rough vacuum, apparatus for sampling the chamber atmosphere at both high and rough vacuums that includes a mass spectrometer for analyzing the atmosphere within the chamber,
 a pressure converter having an outlet port connected to the mass spectrometer and an inlet port connected to the chamber through which samples flow from said chamber to said mass spectrometer, said inlet port communicating with the outlet port by an enclosed compartment,
 means connected to the outlet port of the pressure converter for placing the mass spectrometer at said high vacuum,
 a closure plate movable mounted in said compartment having a central opening therein,
 an aperture plate seated in the central opening and having a restricted orifice,
 actuating means for selectively moving the closure plate into sealing contact against one of the said ports when the chamber is at a rough vacuum to provide a restriction to the sample flow moving to the mass spectrometer and for moving said closure plate away from said one port when the chamber is at a high vacuum to remove said restriction to the sample flow moving to the mass spectrometer, and including a post that is movable with said actuating means into and out of sealing engagement with said aperture plate for sealing the vacuum chamber from said mass spectrometer, and
 lost-motion coupling means operatively connected to the actuating means for selectively closing the restricted orifice when the closure plate is sealed against said one port such that the post is biased against said aperture plate to terminate the sample, lifting the post from the aperture plate over a first range of travel of the actuating means with said closure plate biased sealed against said one port to provide restricted flow, and lifting said closure plate from said one port over a second range of travel of the actuating means to provide unrestricted sample flow, said lost-motion coupling means including an upper member affixed on said post, said upper member engaging said closure plate during said second range of travel but not engaging the same until the end of said first range of travel, and a compression spring over said post and disposed between said upper member and said aperture plate for the dual functions of urging the latter in seating engagement in said closure plate and effecting lost motion by biasing said closure plate against said one port while said actuating means is said first range of travel.

2. The apparatus of claim 1 wherein said aperture plate is removably mounted within said compartment so that aperture plates having different size orifices can be interchanged within said compartment.

3. The apparatus of claim 1 that further includes a sensing means associated with said actuating means for detecting the position of the plate within said chamber.

4. The apparatus of claim 3 wherein said sensing means further includes a spring biased detent means for locking against said actuating means when said past moved away from said aperture plate to prevent further movement of said actuating means, and manually operated means for unlocking the actuating means to permit the closure plate to be moved away from said one port.

* * * * *

UNITED STATES PATENT AND TRADEMARK OFFICE
CERTIFICATE OF CORRECTION

PATENT NO. : 4,672,203

DATED : June 9, 1987

INVENTOR(S) : David H. Holkeboer

It is certified that error appears in the above-identified patent and that said Letters Patent is hereby corrected as shown below:

In Column 6, line 47 - "movable" should be "movably"

In Column 8, line 12 - "past" should be "post"

line 13 - insert "is" before "moved"

Signed and Sealed this

Twenty-second Day of September, 1987

Attest:

DONALD J. QUIGG

Attesting Officer     Commissioner of Patents and Trademarks